(12) United States Patent
Gu et al.

(10) Patent No.: US 11,862,222 B2
(45) Date of Patent: Jan. 2, 2024

(54) REFRESH CIRCUIT AND MEMORY

(71) Applicant: CHANGXIN MEMORY TECHNOLOGIES, INC., Hefei (CN)

(72) Inventors: Yinchuan Gu, Hefei (CN); Geyan Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 195 days.

(21) Appl. No.: 17/456,635

(22) Filed: Nov. 27, 2021

(65) Prior Publication Data
US 2022/0246203 A1    Aug. 4, 2022

Related U.S. Application Data

(63) Continuation of application No. PCT/CN2021/109273, filed on Jul. 29, 2021.

(30) Foreign Application Priority Data

Jan. 29, 2021 (CN) .......................... 202110128762.X

(51) Int. Cl.
*G11C 11/406*    (2006.01)
*G11C 11/408*    (2006.01)
*H03K 19/20*    (2006.01)

(52) U.S. Cl.
CPC ...... *G11C 11/40626* (2013.01); *G11C 11/406* (2013.01); *G11C 11/408* (2013.01); *H03K 19/20* (2013.01)

(58) Field of Classification Search
CPC ................ G11C 11/401; G11C 11/406; G11C 11/40626; H10B 12/00
See application file for complete search history.

(56) References Cited

U.S. PATENT DOCUMENTS 8,547,759 B2    10/2013  Kadowaki
8,787,104 B2    7/2014   Kim
(Continued)

FOREIGN PATENT DOCUMENTS

CN    101432817 A    5/2009
CN    101432817 B    5/2012
(Continued)

OTHER PUBLICATIONS

Supplementary European Search Report in the European application No. 21867904.1, dated Dec. 1, 2022.
(Continued)

*Primary Examiner* — Alfredo Bermudez Lozada
(74) *Attorney, Agent, or Firm* — Syncoda LLC; Feng Ma

(57) ABSTRACT

A refresh circuit includes: a refresh control module configured to receive a refresh command to output a row address refresh signal, the row address refresh signal being outputted a number of times of a preset value each time the refresh command is received; and further configured to receive a temperature signal to adjust the preset value, the higher a temperature represented by the temperature signal, the greater the adjusted preset value; a row addresser configured to receive the row address refresh signal and output a to-be-refreshed single-row address; and an array refresh device configured to perform a single-row refresh operation according to the single-row address and output a single-row refresh end signal after the end of single-row refresh.

14 Claims, 3 Drawing Sheets

(56) References Cited

U.S. PATENT DOCUMENTS

| | | |
|---|---|---|
| 9,030,905 B2 | 5/2015 | Jeong |
| 9,275,717 B2 | 3/2016 | Jung et al. |
| 9,311,987 B2 | 4/2016 | Jeong |
| 9,490,004 B2 | 11/2016 | Jeong |
| 9,892,778 B1 * | 2/2018 | Byeon ................ G11C 7/1063 |
| 10,665,273 B2 | 5/2020 | Kim et al. |
| 2009/0238020 A1 | 9/2009 | Mayer |
| 2012/0039133 A1 | 2/2012 | Kadowaki |
| 2012/0170396 A1 * | 7/2012 | Kim ................ G11C 11/40626 |
| | | 365/222 |
| 2013/0308405 A1 | 11/2013 | Jeong |
| 2014/0029367 A1 | 1/2014 | Jung |
| 2015/0221362 A1 | 8/2015 | Jeong |
| 2016/0180921 A1 | 6/2016 | Jeong |
| 2019/0189194 A1 | 6/2019 | Kim et al. |

FOREIGN PATENT DOCUMENTS

| | | |
|---|---|---|
| CN | 102655022 A | 9/2012 |
| CN | 103578526 A | 2/2014 |
| CN | 107068174 A | 8/2017 |
| CN | 107463724 A | 12/2017 |
| CN | 107578792 A | 1/2018 |
| CN | 109949844 A | 6/2019 |
| CN | 112837727 A | 5/2021 |

OTHER PUBLICATIONS

International Search Report (ISR) in international application No. PCT/CN2021/109273 dated Oct. 26, 2021.
International Search Report in Application No. PCT/CN2021/106730, dated Nov. 1, 2021.

* cited by examiner

REFRESH CIRCUIT AND MEMORY

CROSS-REFERENCE TO RELATED APPLICATIONS

This is a continuation of International Application No. PCT/CN2021/109273 filed on Jul. 29, 2021, which claims priority to Chinese Patent Application No. 202110128762.X filed on Jan. 29, 2021. The disclosures of the above-referenced applications are hereby incorporated by reference in its entirety.

BACKGROUND

In order to preserve data in a volatile memory, a refresh operation is required to be performed on the volatile memory periodically. The refresh operation is required to refresh all rows within a data hold time. The data hold time of the volatile memory is related to a temperature of a chip. The data hold time is shorter at a high temperature, and longer at a low temperature.

SUMMARY

Embodiments of the present disclosure relate to the field of semiconductors, and in particular, to a refresh circuit and a memory.

The embodiments of the present disclosure provide a refresh circuit and a memory, which help reduce the consumption of refresh currents.

In order to solve the above problem, the embodiments of the present disclosure provide a refresh circuit, including: a refresh control module configured to receive a refresh command to output a row address refresh signal, the row address refresh signal being outputted a number of times of a preset value each time the refresh command is received; and further configured to receive a temperature signal to adjust the preset value, the higher a temperature represented by the temperature signal, the greater the adjusted preset value; a row addresser configured to receive the row address refresh signal and output a to-be-refreshed single-row address; and an array refresh device configured to perform a single-row refresh operation according to the single-row address and output a single-row refresh end signal after the end of single-row refresh.

Correspondingly, the embodiments of the present disclosure further provide a memory, including the refresh circuit according to any one of the above items.

Various embodiments of the present disclosure can have one or more of the following advantages.

The preset value is adjusted based on the temperature signal, so that each refresh command at a high temperature corresponds to a larger number of refreshed rows and each refresh command at a low temperature corresponds to a smaller number of refreshed rows. In a case where a time interval between adjacent refresh commands remains unchanged, in a high-temperature environment, a larger number of rows are refreshed under each refresh command within a shorter data hold time, which helps ensure completion of refresh of all row addresses; in a low-temperature environment, a smaller number of rows are refreshed under each refresh command within a longer data hold time, which helps prevent repeated refresh caused by early completion of refresh of all row addresses, so as to reduce a waste of refresh currents and reduce a refresh current corresponding to each refresh command.

In addition, a difference between numbers of refreshed rows corresponding to adjacent temperature signals is limited to a smaller range, which helps adjust a number of refreshed rows corresponding to the refresh command at different temperatures more precisely and reduces the waste of refresh currents.

BRIEF DESCRIPTION OF THE DRAWINGS

One or more embodiments are exemplarily described by using figures that are corresponding thereto in the accompanying drawings; the exemplary descriptions do not constitute limitations on the embodiments. Elements with same reference numerals in the accompanying drawings are similar elements. Unless otherwise particularly stated, the figures in the accompanying drawings do not constitute a scale limitation.

DETAILED DESCRIPTION

In order to make the objectives, technical solutions and advantages of the embodiments of the present disclosure clearer, various embodiments of the present disclosure will be described below in detail with reference to the drawings. However, those of ordinary skill in the art may understand that, in the embodiments of the present disclosure, numerous technical details are set forth in order to enable a reader to better understand the present disclosure. However, the technical solutions claimed in the present disclosure can be implemented without these technical details and various changes and modifications based on the embodiments below.

In a conventional art, based on a standard of meeting medium and high temperatures, a refresh command at a corresponding time interval is sent according to a data hold time in a medium-high temperature environment. A fixed number of rows are refreshed under each refresh command. Therefore, all row addresses may be refreshed in advance within a corresponding longer data hold time at normal or low temperatures, but the refresh command may still be sent according to a fixed time interval. In this case, refresh may start from Row 0 again, but this part is the unnecessary refresh within the data hold time, which wastes currents.

Figure 1:
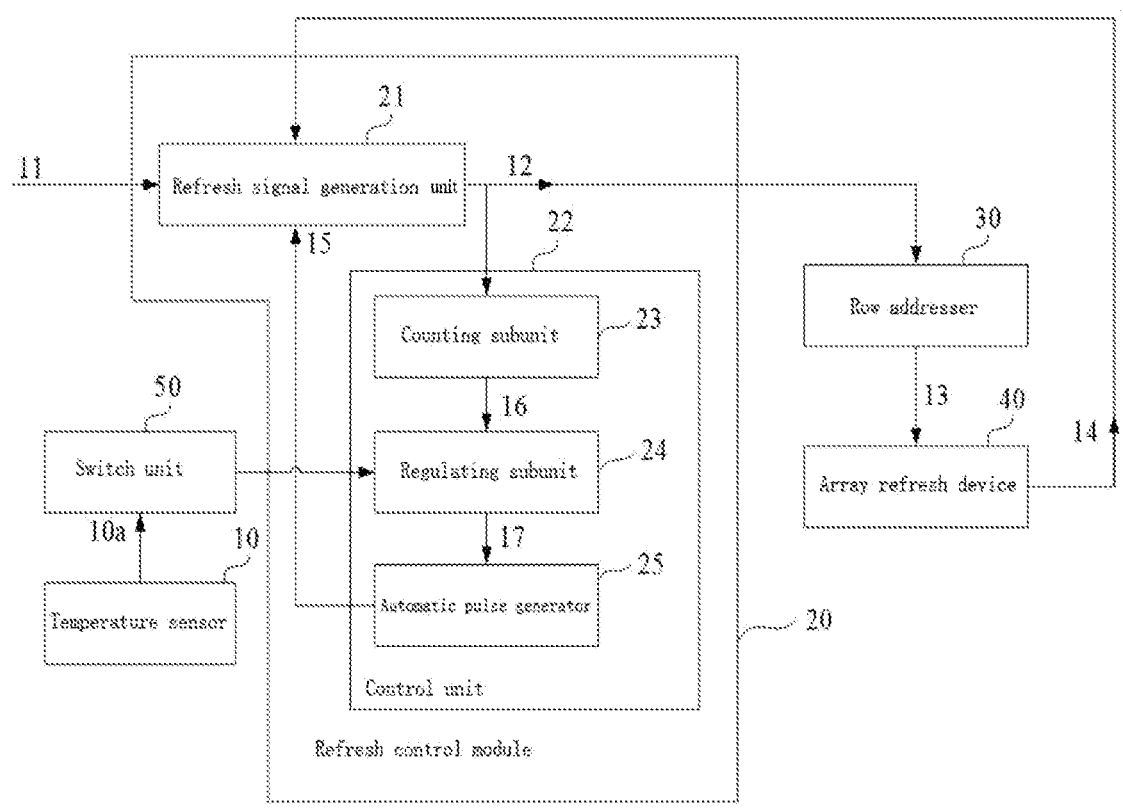
FIG. 1 is a first schematic structural diagram of a refresh circuit according to an embodiment of the present disclosure.

Referring to FIG. 1, a refresh circuit includes: a refresh control module 20 configured to receive a refresh command 11 to output a row address refresh signal 12, the row address refresh signal 12 being outputted a number of times of a preset value each time the refresh command 11 is received; and further configured to receive a temperature signal 10*a* to adjust the preset value, the higher a temperature represented by the temperature signal 10*a*, the greater the adjusted preset value; a row addresser 30 configured to receive the row address refresh signal 12 and output a to-be-refreshed single-row address 13; and an array refresh device 40 configured to perform a single-row refresh operation according to the single-row address 13 and output a single-row refresh end signal 14 after the end of single-row refresh.

Each time the row addresser 30 receives one row address refresh signal 12, it outputs one to-be-refreshed single-row address 13. The single-row address 13 corresponds to each row of an array in the array refresh device 40. Each time the row address refresh signal 12 is received, address information included in the single-row address 13 is increased by 1; that is, the address information is increased successively according to an order of Row 0, Row 1 and Row 2, until all row addresses are sent. Correspondingly, the array refresh device 40 performs refresh row by row based on the received single-row address 13, and when the row addresser 30 sends all the row addresses, the array refresh device 40 refreshes all the rows correspondingly. It is to be noted that, if the row addresser 30 continuously receives the row address refresh signal 12 after sending all the row addresses, all the row addresses are sent again according to an order of Row 0, Row 1, Row 2 . . . .

In this embodiment, the refresh control module 20 includes: a control unit 22 configured to receive the row address refresh signal 12 and output a reset signal 15; and further configured to count the row address refresh signal 12, and output the reset signal 15 when a count value is equal to the adjusted preset value; and a refresh signal generation unit 21 configured to receive the refresh command 11, the reset signal 15 and the single-row refresh end signal 14 and output the row address refresh signal 12; output the row address refresh signal 12 when receiving the refresh command 11; detect the reset signal 15 when receiving the single-row refresh end signal 14, output the row address refresh signal 12 when not receiving the reset signal 15, and suspend outputting the row address refresh signal 12 when receiving the reset signal 15.

Further, the control unit 22 includes: a counting subunit 23 configured to receive the row address refresh signal 12, count the received row address refresh signal 12, and output the count value 16; a regulating subunit 24 configured to receive the temperature signal 10a and the count value 16 and output an excitation signal 17; and configured to adjust the preset value based on the temperature signal 10a, and output the excitation signal 17 when the count value 16 is equal to the adjusted preset value; and an automatic pulse generator 25 configured to receive the excitation signal 17 and output the reset signal 15.

Figure 2:
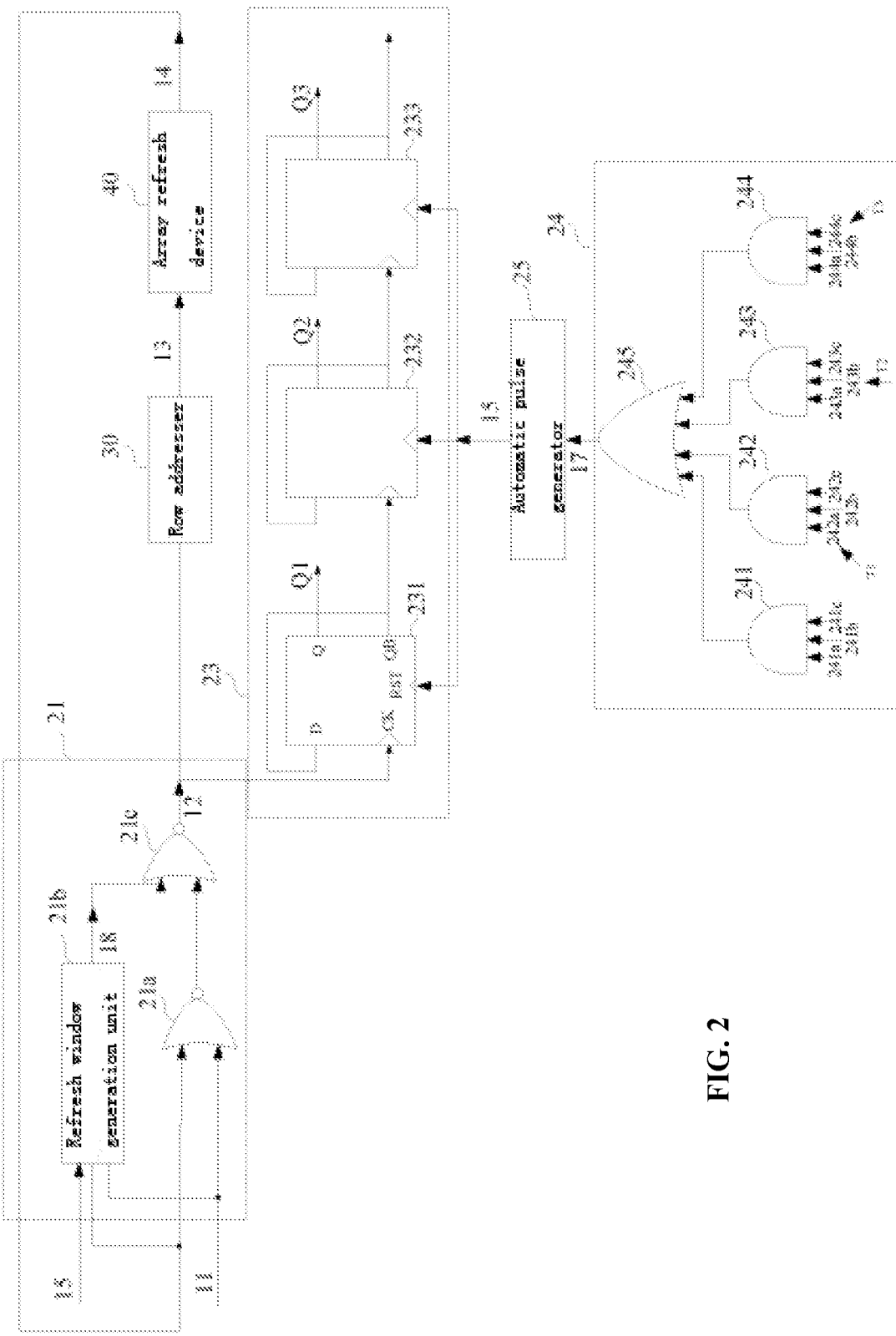
FIG. 2 is a second schematic structural diagram of a refresh circuit according to an embodiment of the present disclosure.

Referring to FIG. 1 and FIG. 2, in this embodiment, the counting subunit 23 includes an asynchronous binary addition counter composed of a plurality of D flip-flops connected in series, the regulating subunit 24 includes an OR gate and a plurality of AND gates, at least one input terminal of the AND gate is connected to a counting terminal of the asynchronous binary addition counter, an output terminal of the AND gate is connected to an input terminal of the OR gate, and an output terminal of the OR gate acts as an output terminal of the regulating subunit 24; all input terminals of at least one of the AND gates are connected to a counting terminal of the asynchronous binary addition counter, and when a level of the counting terminal represents a default value, at least one of the AND gates outputs a high level; and one input terminal of at least another one of the AND gates receives the temperature signal 10a, and when the level of the counting terminal represents a first value, at least another one of the AND gates outputs a high level, the first value being less than the default value.

A number of the D flip-flops forming the asynchronous binary addition counter is related to a maximum number of refreshed rows corresponding to a single refresh command 11. The larger the maximum number of refreshed rows, the greater the number of the D flip-flops; the smaller the maximum number of refreshed rows, the smaller the number of the D flip-flops. Specifically, a maximum count value of n D flip-flops is $2^n-1$, and the maximum count value is required to be greater than or equal to the maximum number of refreshed rows. For example, when the maximum number of refreshed rows is 7, the number of the D flip-flops is at least 3.

The D flip-flop has a data input terminal D, a clock input terminal CK, a first data output terminal Q, a second data output terminal QB and a reset terminal RST. The first data output terminal Q is complementary to the second data output terminal QB. A working principle and a connection manner of the asynchronous binary addition counter are described in detail below by taking three D flip-flops as an example.

The asynchronous binary addition counter (hereinafter referred to as "counter") includes a first D flip-flop 231 as a low order, a second D flip-flop 232 as a next high order, and a third D flip-flop 233 as a high order. The second data output terminal QB of each D flip-flop is connected to the data input terminal D and is connected to the clock input terminal CK of a next-stage D flip-flop. The first data output terminal Q of each D flip-flop acts as a counting terminal. The reset terminal RST resets the level after the reset signal 15 is received, which represents 0. The clock input terminal CK of the first D flip-flop 231 is configured to receive the row address refresh signal 12, and the first D flip-flop 231 has a first counting terminal Q1. The second D flip-flop 232 has a second counting terminal Q2. The third D flip-flop 233 has a third counting terminal Q3.

When the D flip-flop represents 1, the corresponding counting terminal is at a high level. When data recorded by a relatively-low-order D flip-flop reaches 2, the relatively-low-order D flip-flop is required to be carried to a next-stage relatively-high-order D flip-flop. In this case, the relatively-low-order D flip-flop is reset, representing 0, and the relatively-high-order D flip-flop is carried, representing 1, which forms "carry 1 to a higher bit when the low bit reaches 2" in binary.

Specifically, the counter is in an initial state when not receiving a first row address refresh signal 12, and the count value Q3Q2Q1=000. Each time one row address refresh signal 12 is received, the count value is increased once; that is, the count value Q3Q2Q1 is increased according to an order of 000, 001, 010, 011, 100, 101, 110 and 111. The count value Q3Q2Q1, when converted to decimal, represents 0, 1, 2, 3, 4, 5, 6 and 7 respectively. After the counter receives the reset signal, the count value Q3Q2Q1 is reset to the initial state of 000.

In addition, a number of the AND gate is related to a number of the received temperature signal 10a. Different temperature signals 10a represent different temperature intervals, and preset values of the refreshed rows adjusted by the regulating subunit 24 based on the temperature signals 10a are also different; therefore, n temperature signals 10a correspond to n adjusted preset values. In this embodiment, each adjusted preset value corresponds to one AND gate, and n temperature signals require n+1 AND gates. At least two AND gates are provided.

In this embodiment, a number of input terminals of the AND gate is less than or equal to a number of the D flip-flops in the counting subunit 23. Since the number of the D flip-flops determines a maximum count value of the counting subunit 23, an optional range of preset values at different temperatures may be expanded by increasing the number of the D flip-flops, so as to refresh all row addresses in time at extreme temperatures and reduce the waste of refresh currents.

A structure of the regulating subunit 24 and a connection relationship between the regulating subunit 24 and the counting subunit 23 are illustrated below with a specific example. In the specific example, the regulating subunit 24 is configured to receive a first temperature signal T1, a second temperature signal T2 and a third temperature signal T3. The first temperature signal T1 represents that a current temperature is less than or equal to a first temperature and greater than a second temperature. The second temperature signal T2 represents that the current temperature is less than or equal to the second temperature and greater than a third temperature. The third temperature signal T3 represents that the current temperature is less than or equal to the third temperature.

Correspondingly, when the current temperature is greater than the first temperature, the number of refreshed rows corresponding to each refresh command 11 is 7; that is, the default value is 7. Within a temperature interval represented by the first temperature signal T1, the number of refreshed rows corresponding to each refresh command 11 is 6. Within a temperature interval represented by the second temperature signal T2, the number of refreshed rows corresponding to each refresh command 11 is 5. Within a temperature interval represented by the third temperature signal T3, the number of refreshed rows corresponding to each refresh command 11 is 3.

In order to realize the above specific example, the regulating subunit 24 according to the embodiment of the present disclosure includes four AND gates. A number of input terminals of the AND gates is equal to the number of the D flip-flops. Specifically, The regulating subunit 24 includes a first AND gate 241, a second AND gate 242, a third AND gate 243, a fourth AND gate 244 and an OR gate 245. The first AND gate 241 has a first input terminal 241a connected to the first counting terminal Q1, a second input terminal 241b connected to the second counting terminal Q2, and a third input terminal 241c connected to the third counting terminal Q3. The second AND gate 242 has a first input terminal 242a configured to receive the first temperature signal T1, a second input terminal 242b connected to the second counting terminal Q2, and a third input terminal 242c connected to the third counting terminal Q3. The third AND gate 243 has a first input terminal 243a connected to the first counting terminal Q1, a second input terminal 243b configured to receive the second temperature signal T2, and a third input terminal 243c connected to the third counting terminal Q3. The fourth AND gate 244 has a first input terminal 244a connected to the first counting terminal Q1, a second input terminal 244b connected to the second counting terminal Q2, and a third input terminal 244c configured to receive the third temperature signal T3.

When the regulating subunit 24 does not receive the temperature signal 10a, the first input terminal 242a of the second AND gate 242, the second input terminal 243b of the third AND gate 243 and the third input terminal 244c of the fourth AND gate 244 are always at a low level, and output terminals of the second AND gate 242, the third AND gate 243 and the fourth AND gate 244 are always at a low level. In this case, only the first counting terminal Q1, the second counting terminal Q2 and the third counting terminal Q3 are all at a high level. That is, when the count value 16 of the counting subunit 23 is 7, the first input terminal 241a, the second input terminal 241b and the third input terminal 241c of the first AND gate 241 can all receive high levels, the first AND gate 241 can output a high-level signal, and the OR gate 245 can output a high-level signal, which acts as the excitation signal 17 of the automatic pulse generator 25. The automatic pulse generator 25 generates the reset signal 15 after receiving the excitation signal 17. The reset signal 15, on the one hand, enables the counter to be restored to the initial state, that is, Q3Q2Q1=000; on the other hand, enables the refresh signal generation unit 21 to suspend outputting the row address refresh signal 12.

Correspondingly, when the regulating subunit 24 receives the first temperature signal T1, the first input terminal 242a of the second AND gate 242 is at a high level. In this case, when the second counting terminal Q2 and the third counting terminal Q3 are both at a high level, that is, the count value 16 of the counting subunit 23 is 6, the second AND gate 242 can output a high-level signal to enable the OR gate 245 to send an active-high excitation signal 17 to the automatic pulse generator 25.

Similarly, when the second input terminal 243b of the third AND gate 243 receives the second temperature signal T2 and the first counting terminal Q1 and the third counting terminal Q3 are both at a high level, that is, the count value 16 of the counting subunit 23 is 5, the OR gate 245 sends the excitation signal 17 to the automatic pulse generator 25. When the third input terminal 244c of the fourth AND gate 244 receives the third temperature signal T3 and the first counting terminal Q1 and the second counting terminal Q2 are both at a high level, that is, the count value 16 of the counting subunit 23 is 3, the OR gate 245 sends the excitation signal 17 to the automatic pulse generator 25.

In general, the counting subunit 23 counts the row address refresh signal 12. After the count value reaches the preset value corresponding to the temperature signal 10a, the automatic pulse generator 25 generates the reset signal 15, so that the refresh signal generation unit 21 suspends outputting the row address refresh signal 12. The lower the temperature, the smaller the preset value; therefore, as the temperature decreases, fewer row address refresh signals 12 are outputted under each refresh command 11, and a single refresh command 11 corresponds to a smaller number of refreshed rows. This can reduce a total number of refreshed rows within a relatively-long data hold time and reduce the waste of refresh currents.

In this embodiment, the first temperature signal T1 represents that the current temperature is less than or equal to 85° C. and greater than 45° C. The second temperature signal T2 represents that the current temperature is less than or equal to 45° C. and greater than 0° C. The third temperature signal T3 represents that the current temperature is less than or equal to 0° C.

In this embodiment, a temperature signal may be set every other fixed temperature interval; that is, a temperature interval range represented by the first temperature signal T1 is equal to that represented by the second temperature signal T2.

The temperature interval range represented by the first temperature signal T1 may range from 20° C. to 50° C., which is, for example, 30° C., 35° C., 40° C., 45° C. or the like. This helps ensure that the data hold time corresponding to different temperature signals is different to such an extent that one is required to be added to or subtracted from the preset value. In addition, this helps prevent a too large difference in the data hold time corresponding to different temperature signals, so as to ensure that all the row addresses can be refreshed within the data hold time and prevent the waste of refresh currents.

In addition, a difference between preset values corresponding to adjacent temperature signals may be 1 to 3 rows, for example, 2 rows. The difference is limited to a smaller range, which helps adjust preset values corresponding to the refresh command 11 at different temperatures more precisely and reduces the waste of refresh currents.

A manner in which a specific signal between different functional structures is active is not particularly limited in the present disclosure. The specific signal may be high-level or active-low, or rising-edge or falling-edge active. In this embodiment, the refresh command 11 is an active-high pulse signal, the single-row refresh end signal 14 is an active-high pulse signal, and the reset signal 15 is an active-high pulse signal.

In this embodiment, the refresh signal generation unit 21 includes: a first NOR gate 21a configured to receive the refresh command 11 and the single-row refresh end signal 14; a refresh window generation unit 21b configured to receive the refresh command 11, the single-row refresh end signal 14 and the reset signal 15 and output a refresh window signal 18; output the refresh window signal 18 when receiving the refresh command 11; detect the reset signal 15 when receiving the single-row refresh end signal 14, output the refresh window signal 18 continuously when not receiving the reset signal 15, and suspend outputting the refresh window signal 18 when receiving the reset signal 15; and a second NOR gate 21c configured to receive an output signal of the first NOR gate 21a and the refresh window signal 18 and output the row address refresh signal 12.

The refresh window signal 18 is an active-low window signal. A duration of the refresh window signal 18 is configured to represent a duration corresponding to each refresh command 11 during which the row address refresh signal 12 can be sent.

In this embodiment, the refresh circuit further includes: a switch unit 50, when the switch unit 50 is turned on, the regulating subunit 24 in the refresh control module 20 adjusts the preset value based on the temperature signal 10a, and when the switch unit 50 is turned off, the input terminal of the AND gate receiving the temperature signal 10a is at a low level, the AND gate outputs a low level, and the preset value is a default value. The default value depends on a number of the input terminals of the first AND gate 241, a number of the D flip-flops included in the counter and a connection relationship between the first AND gate 241 and the counter.

Specifically, in this embodiment, the default value is 7. In addition, the switch unit 50 includes a fuse unit. The refresh control module 20 may receive the temperature signal 10a through the fuse unit.

Further, the refresh circuit further includes a temperature sensor 10 configured to detect a temperature of a target chip and output the temperature signal 10a. That is, the refresh circuit adjusts a number of refreshed rows corresponding to each refresh command 11 according to the temperature of the target chip.

Figure 3:
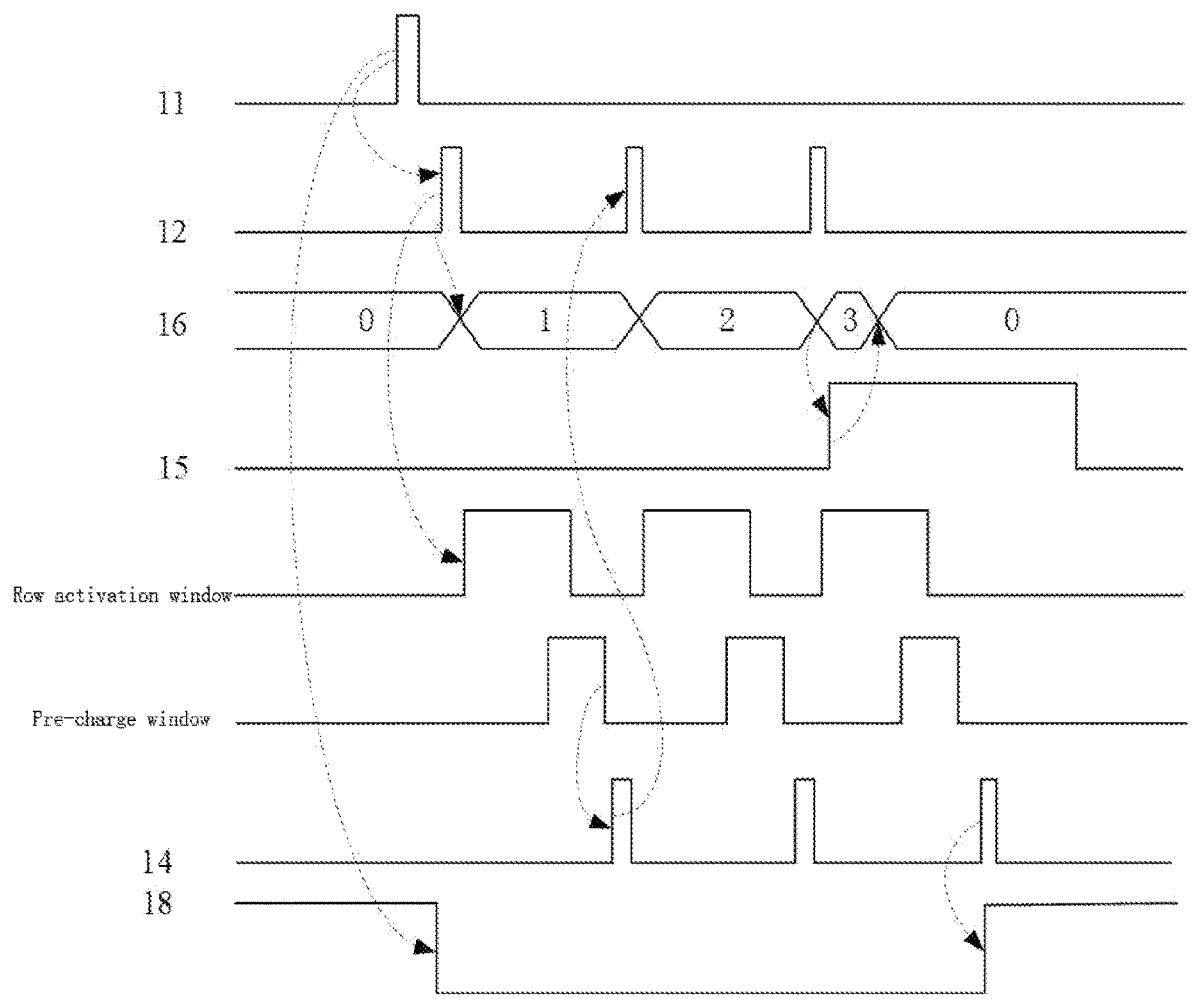
FIG. 3 is a timing diagram of signal generation of the refresh circuit according to an embodiment of the present disclosure.

An operation principle of the refresh circuit is described below with reference to the timing diagram of signal generation of the refresh circuit provided in FIG. 3 with an example in which the regulating subunit 24 receives the third temperature signal T3, and the adjusted preset value is 3. It is to be noted that a dashed line with an arrow in FIG. 3 refers to a causal relationship of signal generation. A start point of the arrow is Cause and an end point is Effect. Specifically, First signal generation process: When an active-high refresh command 11 is received, an output terminal of the first NOR gate 21a changes to a low level. The refresh window generation unit 21b outputs an active-low refresh window signal 18, and an output terminal of the second NOR gate 21c changes to a high level; that is, the refresh signal generation unit 21 outputs an active-high row address refresh signal 12.

Second signal generation process: The row addresser 30 and the counting subunit 23 receive the row address refresh signal 12. The count value 16 outputted by the counting subunit 23 is 1. The row addresser 30 sends a first to-be-refreshed single-row address 13 to the array refresh device 40. The array refresh device 40 performs a refresh operation according to the single-row address 13. The refresh operation includes a row activation window and a pre-charge window. The row activation window is an active-high window signal. Appearance of a row activation window signal represents the start of the single-row refresh operation. A duration of the row activation window is required to be greater than a row addressing time, so as to ensure effective completion of row addressing. The pre-charge window is an active-high window signal. The end of the pre-charge window represents the end of the single-row refresh operation. A duration of the pre-charge window is required to be greater than a pre-charge time, so as to ensure effective completion of pre-charge.

Third signal generation process: The array refresh device 40 outputs the single-row refresh end signal 14 after completing the single-row refresh operation on the single-row address 13. The refresh window generation unit 21b detects the reset signal 15 after receiving the single-row refresh end signal 14. The count value 16 is 1 and has not reached 3 in this case; therefore, the reset signal 15 has not yet been sent, and the refresh window generation unit 21b continuously outputs an active-low refresh window signal 18. At the same time, since the single-row refresh end signal 14 is an active-high pulse signal, the first NOR gate 21a outputs a low level when receiving the single-row refresh end signal 14. In this way, the second NOR gate 21c can output a second row address refresh signal 12, and the second signal generation process is repeated; in this case, the count value 16 changes from 1 to 2.

Fourth signal generation process: After the refresh signal generation unit 21 outputs a third row address refresh signal 12, the count value 16 changes from 2 to 3, the three input terminals of the fourth AND gate 244 are all at a high level, the fourth AND gate 244 outputs a high level, and the OR gate 245 outputs the excitation signal 17. The automatic pulse generator 25 generates the reset signal 15 under the excitation of the excitation signal 17. The reset terminal RST of each D flip-flop receives the reset signal 15, and the level is reset to a low level, representing a value of 0. In this case, the count value 16 is reset from 3 to 0. At the same time, the refresh window generation unit 21b receives the reset signal 15.

Fifth signal generation process: The array refresh device 40 outputs a third single-row refresh end signal 14 after completing a single-row refresh action according to the single-row address 13 corresponding to the third row address refresh signal 12. The refresh window generation unit 21b detects the reset signal 15 after receiving the single-row refresh end signal 14. The automatic pulse generator 25 has sent the reset signal 15 in this case; therefore, the refresh window signal 18 of the refresh window generation unit 21b is suspended, the output terminal of the refresh window generation unit 21b changes from a low level to a high level, and the output terminal of the second NOR gate 21c changes to a low level; that is, the output of the row address refresh signal 12 is suspended, so that the number of refreshed rows corresponding to each refresh command 11 is 3.

It is to be noted that the duration of the reset signal 15 outputted by the automatic pulse generator 25 should be greater than a row addressing time of the row addresser 30 and a single-row refresh time of the array refresh device 40, which ensures that the reset signal 15 continues when the refresh window generation unit 21b receives the third single-row refresh end signal 14, so as to effectively suspend the output of the row address refresh signal 12.

Only one refresh command 11 is taken as an example in the above timing diagram. The refresh window generation unit 21b may output the refresh window signal 18 again when receiving the refresh command 11 again. The refresh circuit repeats the above signal generation processes.

In addition, if the adjusting subunit 24 receives another temperature signal 10a or no longer receives another temperature signal 10a within a refresh period corresponding to the refresh command 11 to lead to an increase in the preset value of the number of refreshed rows corresponding to the refresh command 11, in this case, the refresh circuit performs row address refresh according to the increased preset value as long as the automatic pulse generator 25 has not generated the reset signal 15. Conversely, if the preset value of the number of refreshed rows corresponding to the refresh command 11 is decreased within the refresh period corresponding to the refresh command 11, it is determined whether the current count value 16 is greater than or equal to the decreased preset value, if yes, the output of the row address refresh signal 12 is suspended, and if no, single-row address refresh is performed according to the decreased preset value.

In this embodiment, the preset value is adjusted based on the temperature signal, so that each refresh command at a high temperature corresponds to a larger number of refreshed rows and each refresh command at a low temperature corresponds to a smaller number of refreshed rows. In a case where a time interval between adjacent refresh commands remains unchanged, in a high-temperature environment, a larger number of rows are refreshed under each refresh command within a shorter data hold time, which helps ensure completion of refresh of all row addresses; in a low-temperature environment, a smaller number of rows are refreshed under each refresh command within a longer data hold time, which helps prevent repeated refresh caused by early completion of refresh of all row addresses, so as to reduce a waste of refresh currents and reduce a refresh current corresponding to each refresh command.

Correspondingly, an embodiment of the present disclosure further provides a memory, including the refresh circuit according to any one of the above items. This helps reduce a waste of currents during the refresh of the memory.

Those of ordinary skill in the art may understand that the above implementations are specific embodiments for implementing the present disclosure. However, in practical applications, various changes in forms and details may be made thereto without departing from the spirit and scope of the present disclosure. Any person skilled in the art can make respective changes and modifications without departing from the spirit and scope of the present disclosure. Therefore, the protection scope of the present disclosure should be subject to the scope defined by the claims.

What is claimed is:

1. A refresh circuit, comprising:
  a refresh control module configured to receive a refresh command to output a row address refresh signal, the row address refresh signal being outputted a number of times of a preset value each time the refresh command is received; and further configured to receive a temperature signal to adjust the preset value, the higher a temperature represented by the temperature signal, the greater the adjusted preset value;
  a row addresser configured to receive the row address refresh signal and output a to-be-refreshed single-row address; and
  an array refresh device configured to perform a single-row refresh operation according to the single-row address and output a single-row refresh end signal after the end of single-row refresh;
  wherein the refresh control module comprises:
  a control unit configured to receive the row address refresh signal and output a reset signal; and further configured to count the row address refresh signal, and output the reset signal when a count value is equal to the adjusted preset value; and
  a refresh signal generation unit configured to receive the refresh command, the reset signal and the single-row refresh end signal and output the row address refresh signal; output the row address refresh signal when receiving the refresh command; detect the reset signal when receiving the single-row refresh end signal, output the row address refresh signal when not receiving the reset signal, and suspend outputting the row address refresh signal when receiving the reset signal.

2. The refresh circuit according to claim 1, wherein the control unit comprises:
  a counting subunit configured to receive the row address refresh signal, count the received row address refresh signal, and output the count value;
  a regulating subunit configured to receive the temperature signal and the count value and output an excitation signal; and configured to adjust the preset value based on the temperature signal, and output the excitation signal when the count value is equal to the adjusted preset value; and
  an automatic pulse generator configured to receive the excitation signal and output the reset signal.

3. The refresh circuit according to claim 2, wherein the counting subunit comprises an asynchronous binary addition counter composed of a plurality of D flip-flops connected in series, the regulating subunit comprises an OR gate and a plurality of AND gates, at least one input terminal of the AND gate is connected to a counting terminal of the asynchronous binary addition counter, an output terminal of the AND gate is connected to an input terminal of the OR gate, and an output terminal of the OR gate acts as an output terminal of the regulating subunit;
  all input terminals of at least one of the AND gates are connected to the counting terminal, and when a level of the counting terminal represents a default value, at least one of the AND gates outputs a high level; and
  one input terminal of at least another one of the AND gates receives the temperature signal, and when the level of the counting terminal represents a first value, at least another one of the AND gates outputs a high level, the first value being less than the default value.

4. The refresh circuit according to claim 3, wherein the asynchronous binary addition counter comprises a first counting terminal as a low order, a second counting terminal as a next high order, and a third counting terminal as a high order; and the regulating subunit comprises a first AND gate, a second AND gate, a third AND gate and a fourth AND gate;

the first AND gate has a first input terminal connected to the first counting terminal, a second input terminal connected to the second counting terminal, and a third input terminal connected to the third counting terminal;

the second AND gate has a first input terminal configured to receive a first temperature signal, a second input terminal connected to the second counting terminal, and a third input terminal connected to the third counting terminal;

the third AND gate has a first input terminal connected to the first counting terminal, a second input terminal configured to receive a second temperature signal, and a third input terminal connected to the third counting terminal; and the fourth AND gate has a first input terminal connected to the first counting terminal, a second input terminal connected to the second counting terminal, and a third input terminal configured to receive a third temperature signal, wherein the third temperature signal represents that a current temperature is less than or equal to a third temperature, the second temperature signal represents that the current temperature is less than or equal to a second temperature and greater than the third temperature, and the first temperature signal represents that the current temperature is less than or equal to a first temperature and greater than the second temperature.

5. The refresh circuit according to claim 4, wherein a temperature interval range represented by the first temperature signal is equal to that represented by the second temperature signal.

6. The refresh circuit according to claim 5, wherein the temperature interval range represented by the first temperature signal ranges from 20° C. to 50° C.

7. The refresh circuit according to claim 4, wherein adjacent temperature signals correspond to different preset values, with a difference of 1 to 3 rows.

8. The refresh circuit according to claim 1, wherein the refresh signal generation unit comprises:
a first NOR gate configured to receive the refresh command and the single-row refresh end signal;
a refresh window generation unit configured to receive the refresh command, the single-row refresh end signal and the reset signal and output a refresh window signal; output the refresh window signal when receiving the refresh command; detect the reset signal when receiving the single-row refresh end signal, output the refresh window signal when not receiving the reset signal, and suspend outputting the refresh window signal when receiving the reset signal; and
a second NOR gate configured to receive an output signal of the first NOR gate and the refresh window signal and output the row address refresh signal.

9. The refresh circuit according to claim 1, wherein the refresh command is an active-high pulse signal, and the single-row refresh end signal is an active-high pulse signal; the refresh window signal is an active-low window signal.

10. The refresh circuit according to claim 9, wherein the reset signal is an active-high pulse signal.

11. The refresh circuit according to claim 1, further comprising: a switch unit, the refresh control module adjusting the preset value based on the temperature signal when the switch unit is turned on, and the preset value being a default value when the switch unit is turned off.

12. A refresh circuit, comprising:
a refresh control module configured to receive a refresh command to output a row address refresh signal, the row address refresh signal being outputted a number of times of a preset value each time the refresh command is received; and further configured to receive a temperature signal to adjust the preset value, the higher a temperature represented by the temperature signal, the greater the adjusted preset value;
a row addresser configured to receive the row address refresh signal and output a to-be-refreshed single-row address;
an array refresh device configured to perform a single-row refresh operation according to the single-row address and output a single-row refresh end signal after the end of single-row refresh; and
a switch unit, the refresh control module adjusting the preset value based on the temperature signal when the switch unit is turned on, and the preset value being a default value when the switch unit is turned off;
wherein the switch unit comprises a fuse unit, and the refresh control module receives the temperature signal through the fuse unit.

13. The refresh circuit according to claim 1, further comprising: a temperature sensor configured to detect a temperature of a target chip and output the temperature signal.

14. A memory, comprising a refresh circuit, wherein the refresh circuit comprises:
a refresh control module configured to receive a refresh command to output a row address refresh signal, the row address refresh signal being outputted a number of times of a preset value each time the refresh command is received; and further configured to receive a temperature signal to adjust the preset value, the higher a temperature represented by the temperature signal, the greater the adjusted preset value;
a row addresser configured to receive the row address refresh signal and output a to-be-refreshed single-row address; and
an array, refresh device configured to perform a single-row refresh end signal according to the single-row address and output a single-row refresh end signal after the end of single-row refresh;
wherein the refresh control module comprises:
a control unit configured to receive the row address refresh signal and output a reset signal; and further configured to count the row address refresh signal, and output the reset signal when a count value is equal to the adjusted preset value; and
a refresh signal generation unit configured to receive the refresh command, the reset signal and the single-row refresh end signal and output the row address refresh signal; output the row address refresh signal when receiving the refresh command; detect the reset signal when receiving the single-row refresh end signal, output the row address refresh signal when not receiving the reset signal, and suspend outputting the row address refresh signal when receiving the reset signal.

* * * * *